United States Patent
Lunsman et al.

(10) Patent No.: US 10,237,999 B2
(45) Date of Patent: Mar. 19, 2019

(54) CONFIGURABLE NODE EXPANSION SPACE

(71) Applicant: HEWLETT PACKARD ENTERPRISE DEVELOPMENT LP, Houston, TX (US)

(72) Inventors: Harvey Lunsman, Chippewa Falls, WI (US); Troy Oxby, Chippewa Falls, WI (US); Michael Peterson, Chippewa Falls, WI (US); David Collins, Eau Claire, WI (US); Steven J. Dean, Chippewa Falls, WI (US); Russell Stacy, Chippewa Falls, WI (US); Andy Warner, Fremont, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 8 days.

(21) Appl. No.: 15/339,451

(22) Filed: Oct. 31, 2016

(65) Prior Publication Data

US 2017/0127549 A1    May 4, 2017

Related U.S. Application Data

(60) Provisional application No. 62/249,024, filed on Oct. 30, 2015.

(51) Int. Cl.
*H05K 1/14* (2006.01)
*H05K 7/14* (2006.01)
*H05K 7/20* (2006.01)

(52) U.S. Cl.
CPC ......... *H05K 7/1489* (2013.01); *H05K 7/1487* (2013.01); *H05K 7/20763* (2013.01)

(58) Field of Classification Search
None
See application file for complete search history.

(56) References Cited

U.S. PATENT DOCUMENTS 6,025,989 A  *  2/2000  Ayd .................. G06F 1/183
                                            312/236
7,318,322 B2 *  1/2008  Ota .................... H05K 7/20781
                                            62/259.2

(Continued)

FOREIGN PATENT DOCUMENTS

WO    WO 2015/084325    6/2015
WO    PCT/US16/62076    11/2016

(Continued)

OTHER PUBLICATIONS

U.S. Appl. No. 15/339,483, filed Oct. 31, 2016, Harvey Lunsman, Node Blind Mate Liquid Cooling.

(Continued)

*Primary Examiner* — Xanthia C Cunningham (57) ABSTRACT

The present disclosure is directed to a configurable extension space for a computer server or node blade that has the ability to expand data storage or other functionality to a computer system while minimizing any disruption to computers in a data center when the functionality of a computer server or a node blade is extended. Apparatus consistent with the present disclosure may include multiple electronic assemblies where a first assembly resides deep within an enclosure to which an expansion module may be attached in an accessible expansion space.

20 Claims, 8 Drawing Sheets

(56) References Cited

U.S. PATENT DOCUMENTS

| | | | | |
|---|---|---|---|---|
| 8,027,162 | B2* | 9/2011 | Campbell | H05K 7/2079 |
| | | | | 165/104.33 |
| 8,369,090 | B2* | 2/2013 | Chester | H05K 7/20772 |
| | | | | 165/104.33 |
| 9,155,230 | B2* | 10/2015 | Eriksen | H05K 7/20772 |
| 9,229,497 | B2* | 1/2016 | Dean | G06F 1/20 |
| 9,451,726 | B2* | 9/2016 | Regimbal | H05K 7/20236 |
| 9,803,937 | B2* | 10/2017 | Franz | H05K 7/20254 |
| 2006/0065874 | A1 | 3/2006 | Campbell et al. | |
| 2006/0082970 | A1* | 4/2006 | Walz | H05K 7/20645 |
| | | | | 361/699 |
| 2006/0242354 | A1* | 10/2006 | Johnsen | G06F 13/404 |
| | | | | 710/316 |
| 2007/0002536 | A1* | 1/2007 | Hall | G06F 1/20 |
| | | | | 361/695 |
| 2008/0018212 | A1* | 1/2008 | Spearing | E05D 11/00 |
| | | | | 312/236 |
| 2008/0137284 | A1 | 6/2008 | Flynn et al. | |
| 2008/0212276 | A1 | 9/2008 | Bottom et al. | |
| 2008/0212282 | A1* | 9/2008 | Hall | G06F 1/20 |
| | | | | 361/701 |
| 2009/0273897 | A1 | 11/2009 | Tang et al. | |
| 2010/0101765 | A1 | 4/2010 | Campbell et al. | |
| 2010/0281201 | A1* | 11/2010 | O'Brien | G06F 13/4027 |
| | | | | 710/308 |
| 2013/0254368 | A1* | 9/2013 | Guay | G06F 9/45533 |
| | | | | 709/223 |
| 2013/0315237 | A1* | 11/2013 | Kagan | H04L 47/2408 |
| | | | | 370/389 |
| 2014/0126141 | A1* | 5/2014 | Dean | G06F 1/20 |
| | | | | 361/679.47 |
| 2015/0230360 | A1 | 8/2015 | Canfield et al. | |
| 2016/0065659 | A1* | 3/2016 | Bloch | G06F 9/546 |
| | | | | 709/201 |
| 2017/0127575 | A1 | 5/2017 | Lunsman | |
| 2017/0181322 | A1* | 6/2017 | Shelnutt | H05K 7/20663 |

FOREIGN PATENT DOCUMENTS

| | | |
|---|---|---|
| WO | PCT/US16/62098 | 11/2016 |
| WO | WO 2017/075632 | 5/2017 |
| WO | WO 2017/075633 | 5/2017 |

OTHER PUBLICATIONS

PCT Application No. PCT/US2016/062076 International Search Report and Written Opinion dated Jan. 31, 2017.

PCT Application No. PCT/US2016/062098 International Search Report and Written Opinion dated Feb. 8, 2017.

* cited by examiner

CONFIGURABLE NODE EXPANSION SPACE

CROSS REFERENCE TO RELATED APPLICATIONS

This application claims the priority benefit of U.S. provisional patent application No. 62/249,024 filed Oct. 30, 2015, entitled "Configurable Node Expansion Space," the disclosure of which is incorporated herein by reference. U.S. provisional patent application 62/249,038, filed on Oct. 30, 2015, entitled "Node Blind Mate Liquid Cooling," is also incorporated herein by reference into this application.

BACKGROUND OF THE INVENTION

Field of the Invention

The present invention is generally directed to an apparatus and method for maximizing the number of computing resources that fit within a computer rack. More specifically, the present invention provides for the easy expansion of a computer system by increasing the number of computing resources that reside in an enclosure.

Description of the Related Art

Computing systems in the data center today are frequently provided within server blades (e.g. node blades) that fit into a computer rack. Typically or server blades contain a plurality of devices. Each server blade may be connected cables or internal backplanes that interconnect different devices in a computer rack. These server blades come in standard form factors of depth, a width and a height. When a conventional server blade is installed in a computer rack, it consumes the entire depth, width, and height of a server blade. In order to expand or change functionality provided by a particular server blade, that particular server blade has to be removed from the computer rack and may have to be opened up such that additional components may be installed.

Typically when the functionality of a server blade in a computing rack is augmented, the operation of the computer rack is disturbed. This often requires an entire computer rack to be powered down before the functionality of server blade within the computer rack can be changed. One reason why electronic components computer racks need to be shut down before their functionality can be changed is because one or more of the interconnects associated with the server blade include delicate electronic circuits that may be damaged when contacts leading to the delicate electronic circuits if those contacts are hot plugged (i.e. plugged in or unplugged when power is applied).

When the functionality of the data center is disturbed, the overall computing power available for use by users is reduced, and operations performed by the computers in the data center take longer to complete. As such, by turning off a computer rack, the cost of running the data center increases.

What is needed are apparatus and methods that allow the functionality of a computer rack to be increased by minimizing any disruption of the operation of the data center when compute resources are added to a computer rack in the data center.

SUMMARY OF THE PRESENTLY CLAIMED INVENTION

The presently claimed invention relates to an apparatus and a method for expanding the functionality of a node blade when a node blade is installed in an enclosure.

An apparatus of the presently claimed invention includes a first electronic assembly that attaches to a computer rack. The first electronic assembly including a rear portion that extends into a computer rack and a front portion that includes electrical connectors. This apparatus also includes a second electronic assembly that connects to the first electronic assembly. The second electronic assembly may be connected to the first electronic assembly when the first electronic assembly is attached to the computer rack. After the second electronic assembly is connected to the first electronic assembly it may extend the functionality of the first electronic assembly.

A method consistent with the presently claimed invention includes attaching a first electronic assembly to a computer rack. Here again the first electronic assembly includes a rear portion that extends into a computer rack and a front portion that includes electrical connectors. The presently claimed method may also include attaching a second electronic assembly to the first electronic assembly via electrical connectors of the first electronic assembly when the first electronic assembly is attached to the computer rack. After the second electronic assembly is connected to the first electronic assembly it may extend the functionality of the first electronic assembly.

DETAILED DESCRIPTION

The present disclosure is directed to a configurable extension space for a node blade that may be used to expand data storage or other functionality of a server blade (e.g. a node blade) while minimizing any disruption to the operations in a data center when the functionality a node blade is extended. In certain instances expansion connections included in such a configurable extension space may include PCIe type expansion links. While the present disclosure discusses the use of PCIe expansion links, other types of expansion links may be used in a manner consistent with the present disclosure.

In certain instances, a computer server or node blade expanded by methods and apparatus consistent with the present disclosure may include a cluster interconnect fabric (like Omni-Path, Infiniband, FDR Infiniband, EDR Infiniband). Embodiments of the present disclosure enable functionality of a computer server or node blade to be expanded without disrupting a connection of the cluster interconnect fabric.

A system and method in accordance with the present invention enables high speed PCIe or other expansion routes from the processors to customer configurable devices (i.e. PCIe cards, hard disk drives—HDD, Solid State Drives—SSDs, graphical processing units—GPU, etc.) without compromising the high speed interconnect fabric (for example, Omni-Path, FDR Infiniband, EDR Infiniband) or liquid cooling, and with minimal impact on air cooling.

In this disclosure, a front side of a computer rack corresponds to a portion of a computer rack where service personnel access server blades or other components in an enclosure. A back portion of the computer rack is an internal portion of the enclosure that is opposite to the front side of the enclosure. When service personnel access the computer rack, they may do so by opening a door that is located at the front side of the computer rack. In one embodiment, an apparatus and method in accordance with the present disclosure brings the PCIe or other expansion type routing toward the front of a a node blade. In such embodiments, these expansion connections may be on the side or edge of a blade that is exposed at the front of a computer rack.

An apparatus of the present disclosure may also include connectors that connect to an interconnect fabric at a rear portion of a node blade. In such instances, a side or edge of a node blade faces a rear or internal portion of a computing rack where connectors of an interconnect fabric reside. In such instances these interconnect fabric connectors may not be accessible without removing the node blade from a computer rack. Liquid cooling may also be provided via a blind mating liquid interconnect at the rear (internal) portion of the node blade. This may enable more space on a "front" side of a node blade to be used when functionality of a node blade is expanded. Such blind mate interconnects may be include valves that prevent the movement of liquid when a node blade is not plugged into an computer rack enclosure. In certain other instances this front space may extend out beyond an enclosure that encloses the blade.

Figure 1:
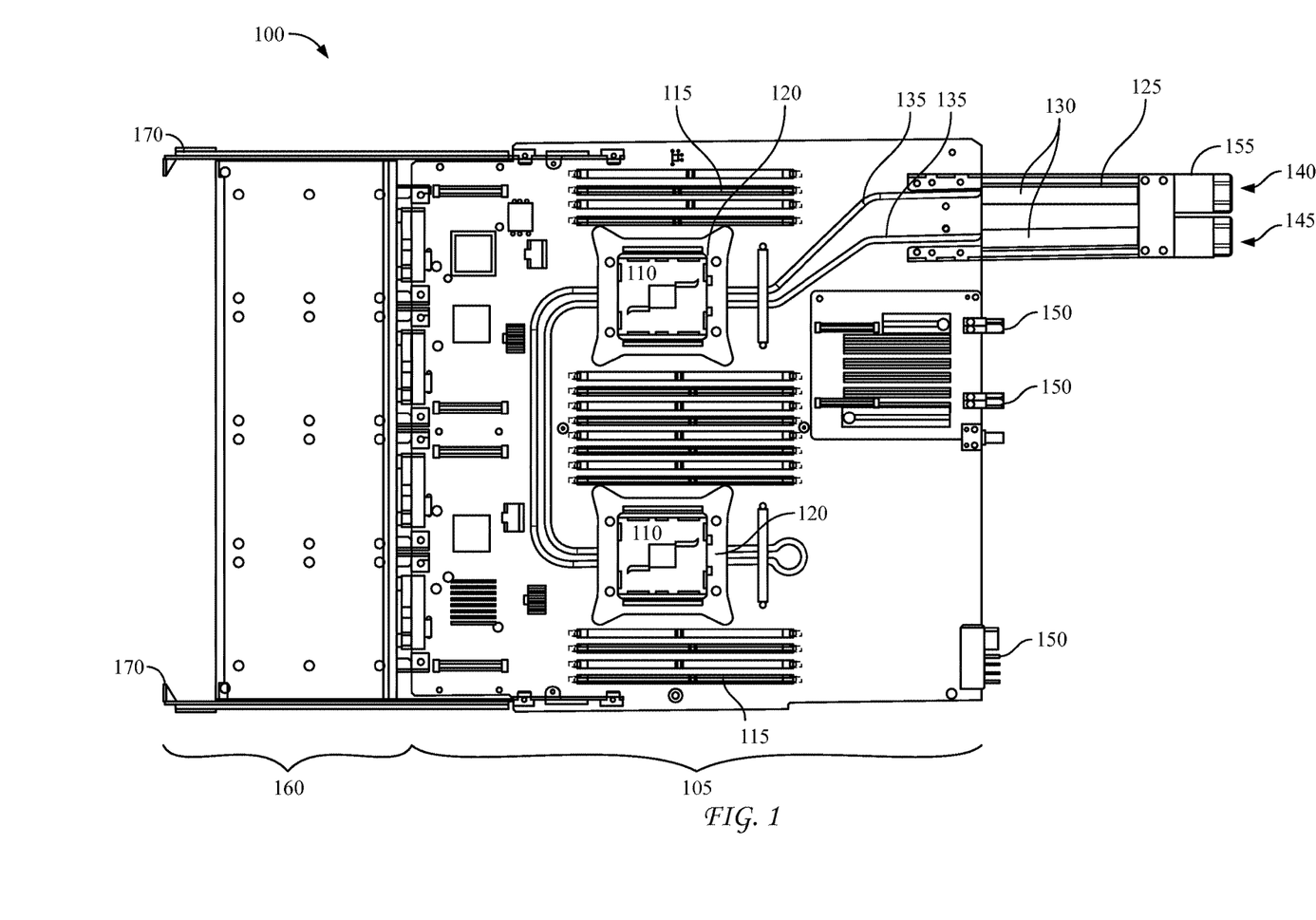
FIG. 1 illustrates an exemplary node blade consistent with the present disclosure.

FIG. 1 illustrates an exemplary node blade consistent with the present disclosure. Node blade 100 of FIG. 1 includes expansion space 160 at a front portion of node blade 100 and a main blade portion 105 at a back portion node blade 100. When node blade 100 is plugged into a computer rack, the expansion space 160 will be at the front of the computer rack to allow expansion space 160 to be accessible to a user without need for removing main node blade 105 from the computer rack. Main blade portion 105 may include processors 110 and heat sinks 120 in thermal contact with processors 110. Main blade portion 105 may also include memory risers 115 and any other electronic components. Main blade portion 105 may also include electrical or optical connections 150 at the rear edge of the blade that allow node blade 100 receive data and power from other node blades or electronic components that may be operating in a computer rack. Node blade 100 also includes locking clips 170 off of top and bottom front edges of node blade 100 for removeably securing node blade 100 into a computer rack. Locking claims 170 may secure main node blade 105 in a computer chassis such that a force of pulling on (and removing) a module in expansion space 160 that is connected to main node blade 105.

The extension space, such as extension space 160, of node blade 100 can include any components desired for a particular computer architecture including, yet not limited to, a hard disk drive (HDD), a solid state disk (SSD), component interconnect cards (such as Peripheral Component Interconnect Express—PCIe) cards or other types of interconnect cards, additional CPUs, GPUs (graphical processing units), RAID expanders/controllers, and/or other electronic components.

Connectors 150 may include electrical connect main blade 105 an interconnect fabric. In instances where extension 160 includes electronic components and when extension 160 is removed from or inserted into a computer rack, data or power connections on connectors 150 may not be compromised or disturbed. Even in instances where the functionality of electronic components located in extension 160 is changed, for example, when a PCIe card is installed in extension, the functionality of maid node blade 105 or connectors 150 may also not be compromised or disturbed. One advantage of this approach is that the size computer rack remains the same even as its functionality is changed. In certain instances, electrical connectors connecting circuits on main node blade 105 to electronic components on extension 160 may be hot pluggable. Locking clips 170 may therefore help guarantee that electronic components in main node blade 105 and/or that liquid flow through main node blade 105 are not disturbed when the functionally within expansion space 160 is changed, even when a module is hot-plugged into or out of expansion space 160.

The presently disclosed configuration eliminates issues associated with expansion links being embedded deep within a computing enclosure where those expansion links may be available through a backplane or a mid-plane of a conventional server blade. Apparatus of the present disclosure provides connectors at a "front portion" of a blade where the expansion connectors at the front portion of the blade are only utilized when they are needed. This provides advantages to personnel of a data center as it allows for relatively greater user configurability/flexibility. When such systems are deployed in a data center, personnel of the data center will easily be able to add different types of devices to a blade. Furthermore, short path lengths between added devices and processors within a blade may be maintained. This approach also provides a way for added devices to be liquid cooled.

Node blade 100 may also include cooling line support 125 extending from a back edge thereof. Cooling line support 125 is preferably a rigid structure that supports and routes cooling lines 130. Cooling lines 130 which may be flexible hoses or ridged pipes. The cooling lines 130 are preferably fluidly connected to blade cooling lines 135, which may also be rigid pipes or flexible hoses. Blade cooling lines 135 may also be fluidly connected with heat sinks 120. As such, cooling liquid may be routed through voids (not depicted) in heat sinks 120. Node blade 100 cooling lines 130 are preferably connected with floating, blind-mate couplings 140 and 145 that each couple to a computer rack liquid cooling system (not shown) chiller. Blind-mate couplings 140 and 145 are more fully disclosed in co-owned U.S. provisional patent application for Node Blind Mate Liquid Coupling 62/249,038 which is incorporated herein by reference in its entirety. Preferably, cooling lines 130 and 135 are part of a single closed cooling loop on node blade 100 and include a liquid input at coupling 140 and liquid output at coupling 145. As shown in FIG. 1, node cooling line 135 may be routed only on main blade portion 105 (as shown in FIG. 1) or may be routed on both main blade portion 105 and extension space 160. FIG. 1 also includes mounting block 155 that may allow couplings 140 and 145 to be flexibly mounted, such that couplings may mate with compatible couplings in a computer rack even when a main node blade is not perfectly aligned when it is installed in the computer rack.

When liquid cooling is brought into this front space from the rear of node blade 105, the liquid cooling may extend across a main portion of the blade and out of a front portion of the main blade 105. Here again, liquid connections may include valves that close when an assembly is not plugged into a server blade. As such, high power devices housed in an expansion space of the present disclosure may be liquid cooled using a circulating liquid. While liquid pipes or hoses are not illustrated in the extension space 160 of FIG. 1, they may be similar to the cooling lines 130 and 135 in FIG. 1. Cooling lines leading to extension space 160 may also be coupled from main blade portion 105 to extension space 160 using blind mate liquid couplings like couplings 140 and 145 of FIG. 1.

Figure 2:
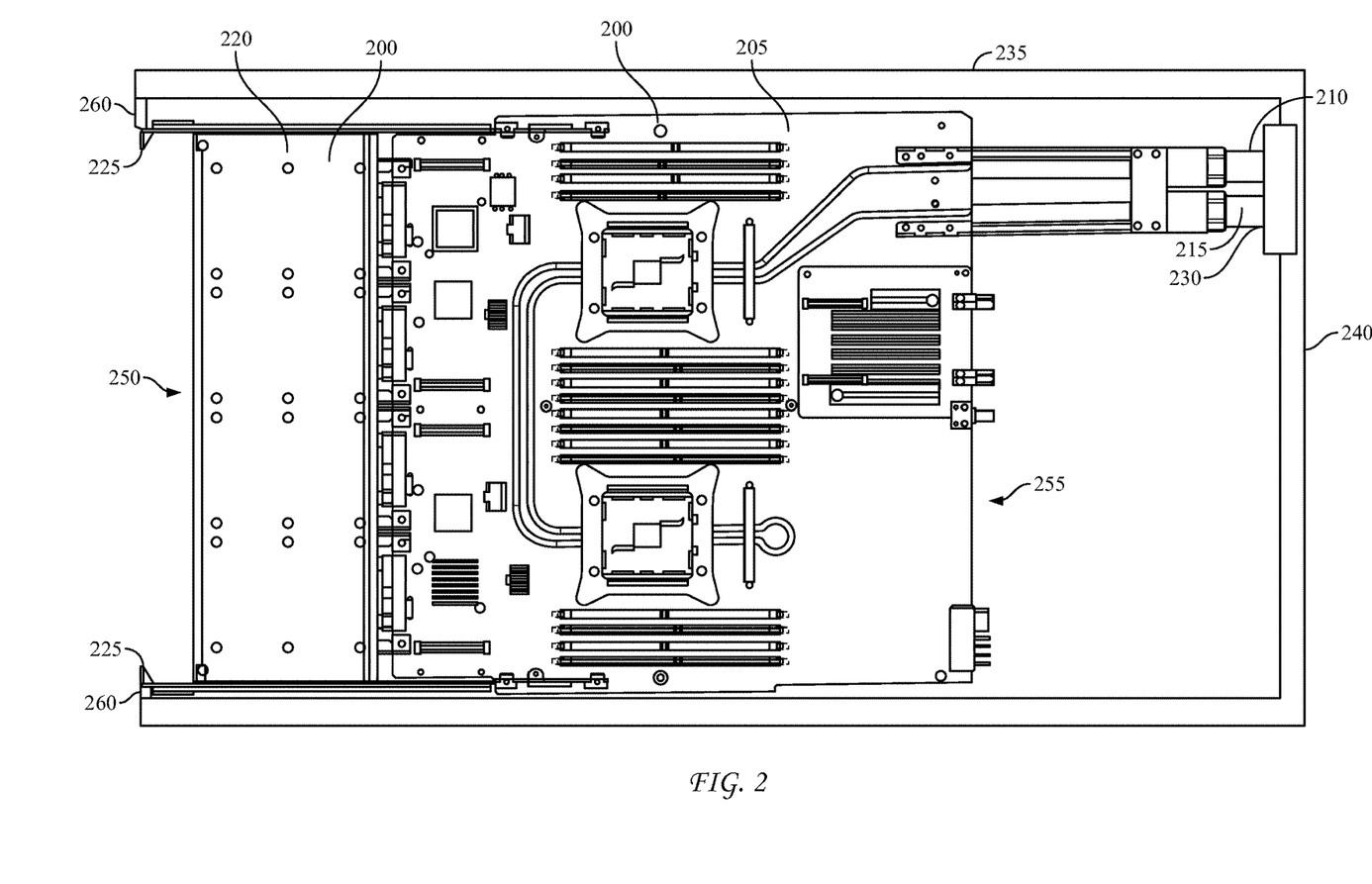
FIG. 2 illustrates a cross sectional view of a computer rack enclosure containing a node blade.

FIG. 2 illustrates a cross sectional view of a computer rack enclosure containing a node blade. FIG. 2 includes rack enclosure 235, node blade 200, cooling connections 210 & 215, and cooling distribution manifold 230. The node blade 200 of FIG. 2 is a main node blade portion 205 and an expansion module 220. The expansion module 220 of node blade 200 is located in front part 250 of computer rack enclosure 235 and the main blade portion 205 of node blade 200 is located in a rear portion 240 of computer rack enclosure 235.

Liquid cooling is provided through a rear of node blade 200 directly to the main node blade 205 from enclosure 235 through cooling distribution manifold 230 and cooling connections 210 & 215. Cooling distribution manifold 230 is located at back portion 240 of rack enclosure 235. Coolant lines connecting main node blade 200 may connect with cooling manifold 230 using blind mate connectors and cooling manifold may be connected to a liquid cooling distribution system (not depicted) connecting a plurality of node blades to enclosure 235.

Since expansion module 220 is located in a front part 250 of enclosure 235, it is easily accessible to operators that maintain a data canter. When an operator wishes to modify functionality contained within the expansion portion 220 of node blade 200 they can simply open a door (not depicted) in computer chassis 235, unplug expansion module 220, and plug in a new module. In another example, main node blade 205 may be powered on be providing services to users of the data center before expansion module 220 has been installed, then an operator may hot plug expansion module 220 into the main node blade 205 when adding a group of solid state drives (SSDs) to an enclosure. Note also that main node blade portion 205 is located in a rear portion 255 of enclosure 235.

FIG. 2 also includes locking clips 225 that engage with mounting point 260 of enclosure 235 to secure node blade 200 therein. Locking clips 225 may securely lock expansion module 220 into place as it is slid into place.

Figure 3:
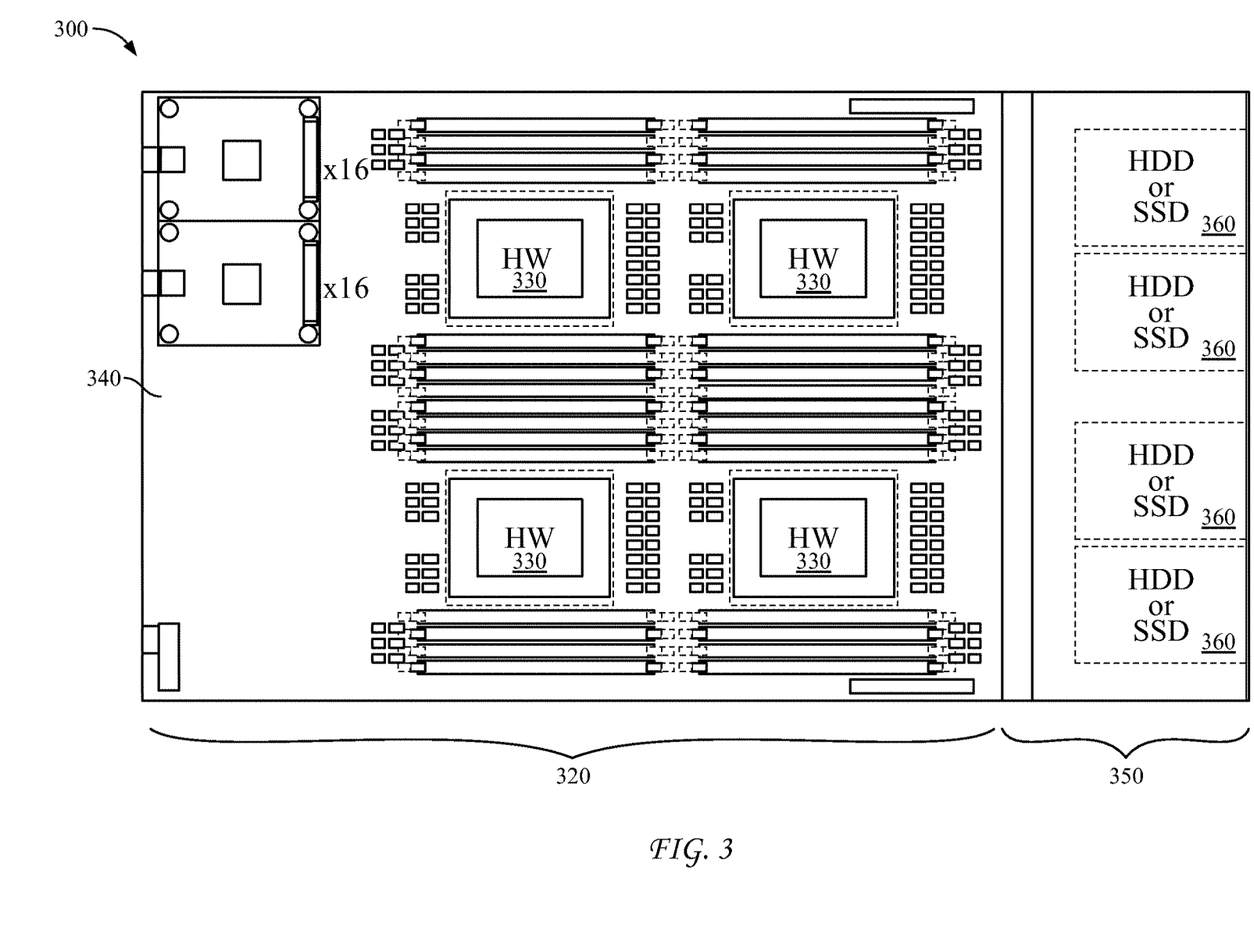
FIG. 3 illustrates an exemplary node blade where an expansion module of the node blade includes data storage drives.

FIG. 3 illustrates an exemplary node blade where an expansion module of the node blade includes data storage drives. FIG. 3 shows node blade 300 including main blade portion 320 having 4 processors 330 and expansion module 350 contains four data storage drives (HDD or SSD). Node blade 100 may include a liquid cooling line and cooling line (not shown) support extending from a rear edge 340 of node blade 300 similar to cooling lines 130 & 135 and cooling line support 125 shown in FIG. 1. Here again expansion module 350 may be plugged into connectors at main blade portion 320 when extending functionality of main blade 320.

FIG. 3 illustrates an exemplary node blade consistent with the present disclosure. FIG. 3 shows node blade 300 including main blade portion 320 having 4 processors 330 and expansion space 350 at a front end of node blade 300. Expansion space 350 includes four HDDs or SSDs 360. Though not shown in FIG. 3, node blade 300 may include a liquid cooling line and cooling line support extending from a rear edge 340 of node blade 300 similar to cooling lines 130 & 135 and cooling line support 125 shown in FIG. 1.

Figure 4:
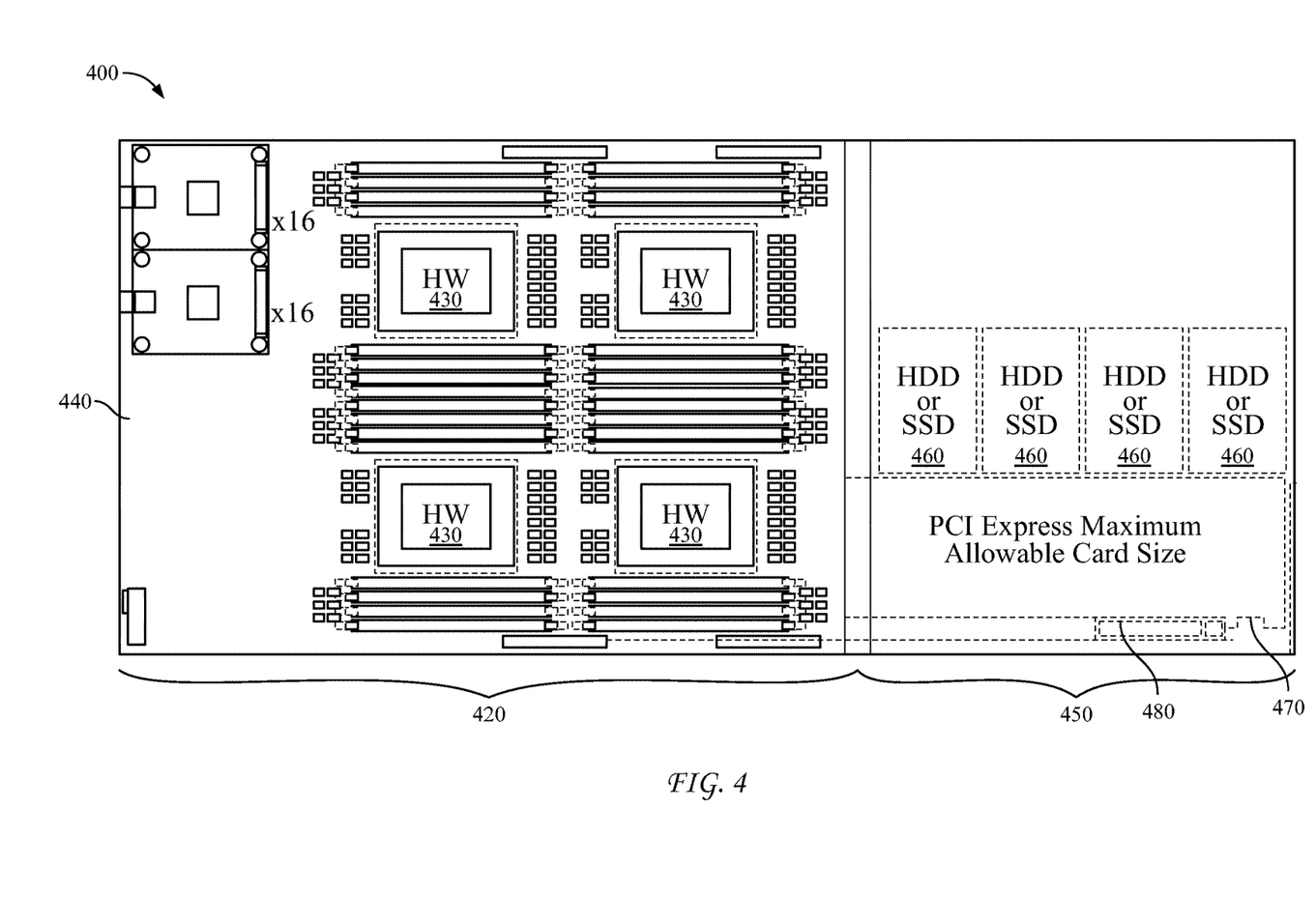
FIG. 4 illustrates a node blade including an expansion module that includes data storage drives and a PCI Express card.

FIG. 4 illustrates a node blade including an expansion module that includes data storage drives and a PCI Express card. FIG. 4 shows node blade 400 including main blade portion 420 having four processors 430 and expansion module 450 at a front end of node blade 400. Expansion space 450 includes a combination of four HDDs or SDDs 460 and a PCI Express card 470, which can be connected to a riser or other suitable connection 480. Though not shown in FIG. 4, node blade 400 may include a liquid cooling line and cooling line support extending from a rear edge 440 of node blade 400 similar to cooling lines 130 & 135 and cooling line support 125 shown in FIG. 1.

Figure 5:
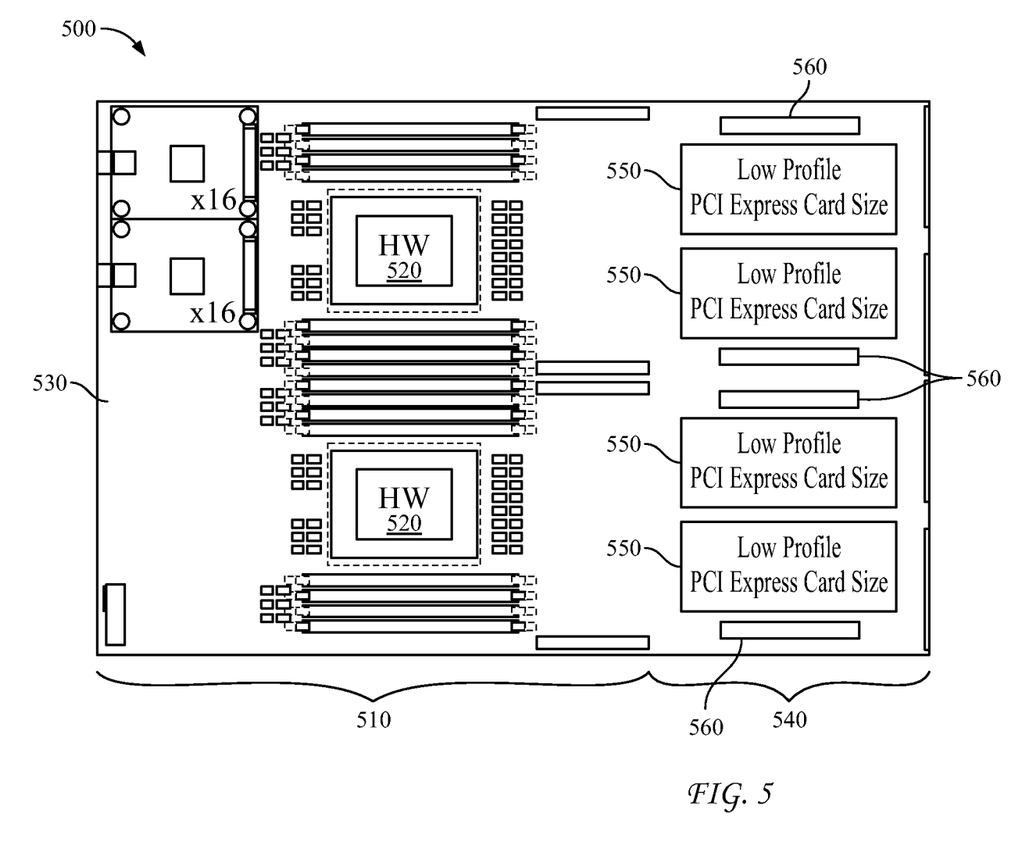
FIG. 5 illustrates another configuration of a node blade where an expansion includes four PCI Express cards.

FIG. 5 illustrates another configuration of a node blade where an expansion includes four PCI Express cards. FIG. 5 shows node blade 500 including main blade portion 510 having two processors 520 and expansion space 540 at a front end of node blade 500. Expansion space 540 includes low profile, PCI Express cards 550 interconnected to risers or other suitable connections 560. Though not shown in FIG. 5, node blade 500 may include a liquid cooling line and cooling line support extending from a rear edge 530 of node blade 500 similar to cooling lines 130 & 135 and cooling line support 125 shown in FIG. 1.

Figure 6:
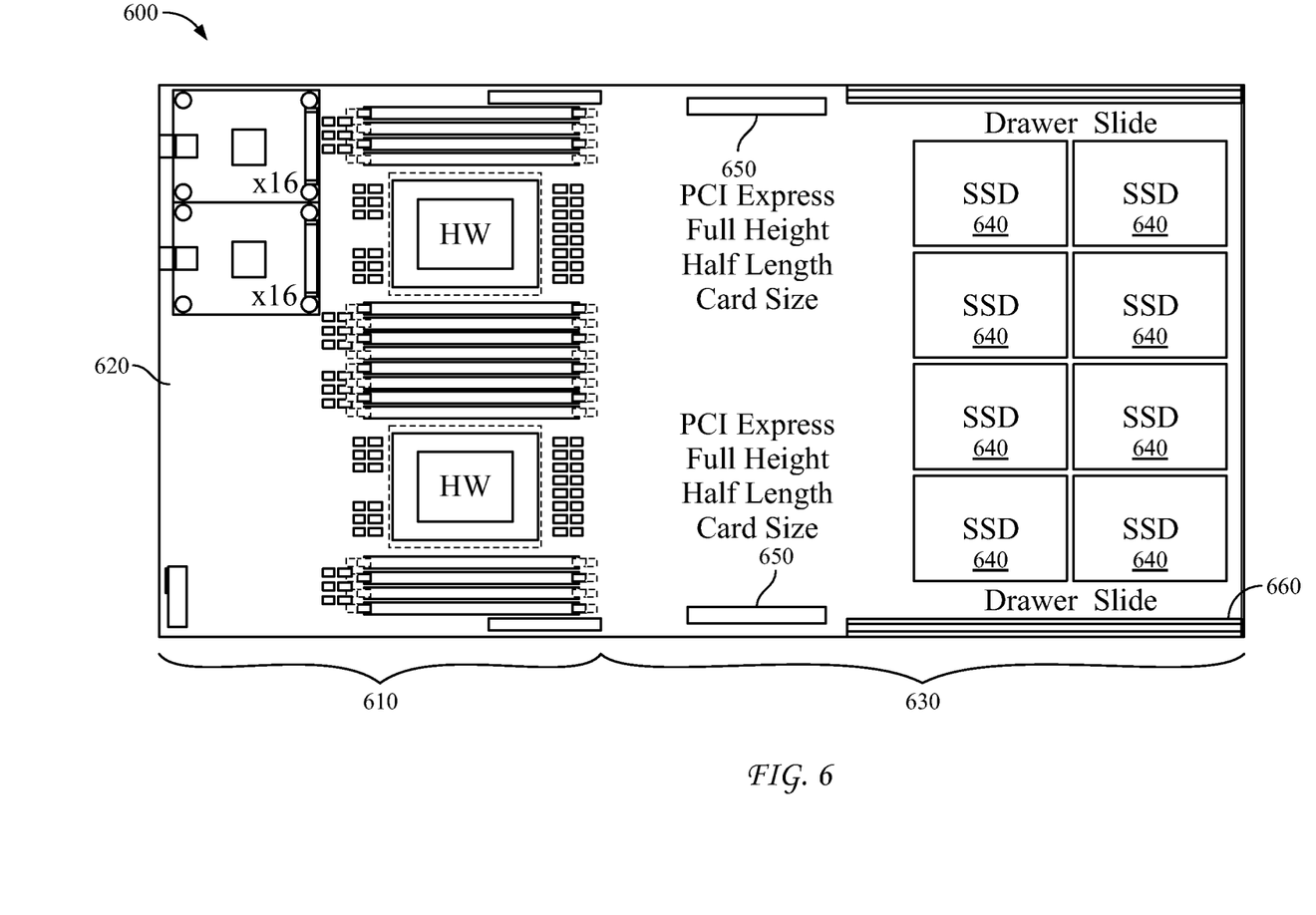
FIG. 6 illustrates a configuration of a node blade that includes a drawer slide.

FIG. 6 illustrates a configuration of a node blade that includes a drawer slide. Node blade 600 includes main blade portion 610 and expansion module 630 at a front end of node blade 600. Expansion space 630 includes a drawer slide 660 that is shown in a partially extended state. Drawer slide 660 of expansion space 630 supports eight SSDs 640 and a stationary portion of expansion space 630 includes two full height PCI Express cards 650. Though not shown in FIG. 6, node blade 600 may include a liquid cooling line and cooling line support extending from a rear edge 620 of node blade 600 similar to cooling lines 130 & 135 and cooling line support 125 shown in FIG. 1.

As illustrated in each of the preceding figures, expansion modules of a node blade consistent with the present disclosure may include any type of electronic assembly in any configuration. As such, an expansion module may include processors, PCIe cards, HDDs, SSDs, GPUs, DRAM, or other electronic functionality.

Figure 7:
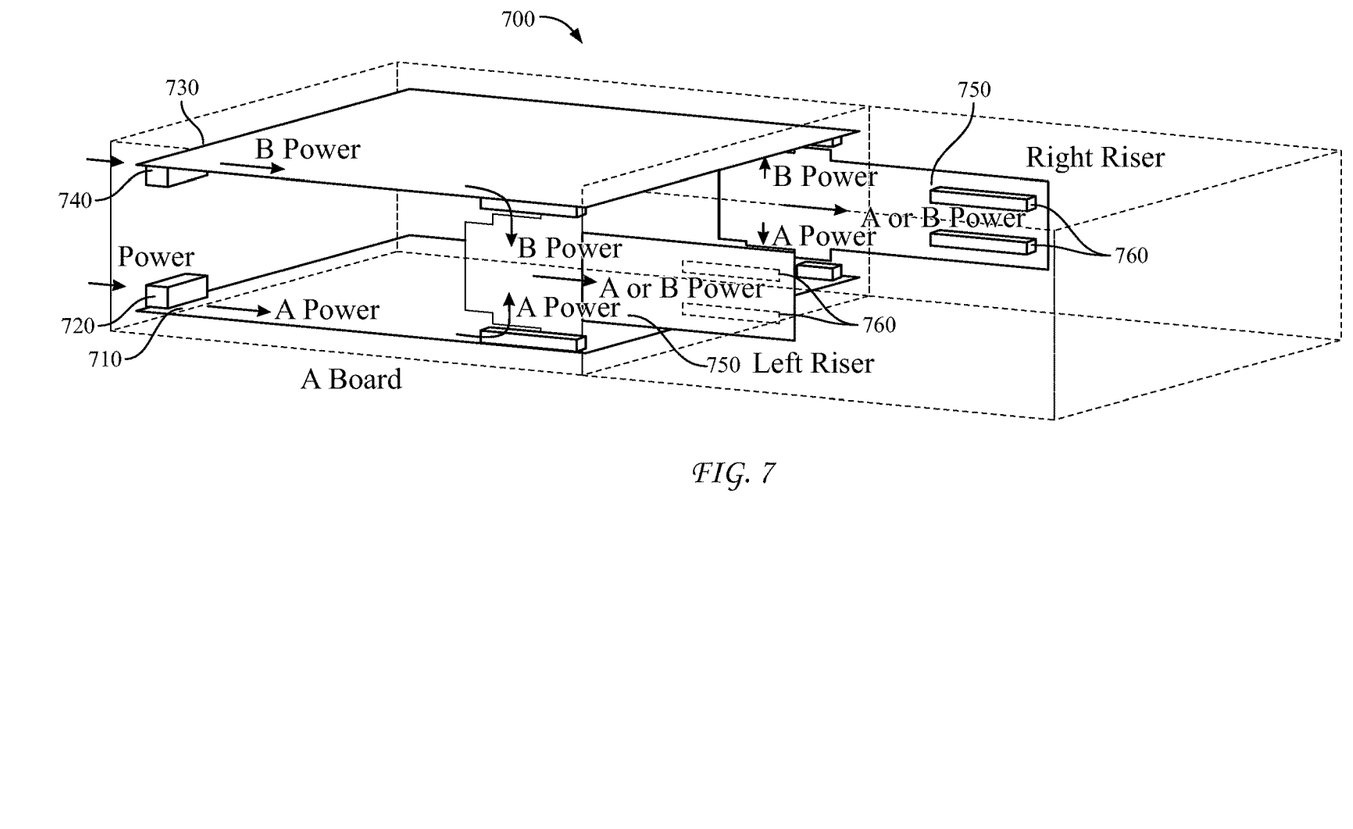
FIG. 7 illustrates an exemplary enclosure that may contain a node blade.

FIG. 7 illustrates an exemplary enclosure that may contain a node blade. Blade enclosure 700 includes a bottom main blade portion 710 and a top main blade portion 730 that face each other. Power may be provided to the bottom and top main blade portions 710 and 730 through power connectors 720 and 740, respectively. Power may be routed through main blade portions 710 and 730 to one or more riser cards 750 that are positioned perpendicularly to, and partially between, main blade portions 710 and 730. Expansion modules may be coupled to riser cards 750 when the functionality of node blade enclosure 700 is expanded. Expansion boards may be electrically coupled to riser cards 750 through riser connectors 760. Power or other electrical connections may be coupled from main blade portions 710 and 730 to expansion modules through riser cards 750. If sufficient power cannot be provided to an expansion space via riser cards 750, supplemental power may be provided to an expansion space using cables (not depicted) that can be connected to power connectors on the node blade.

Figure 8:
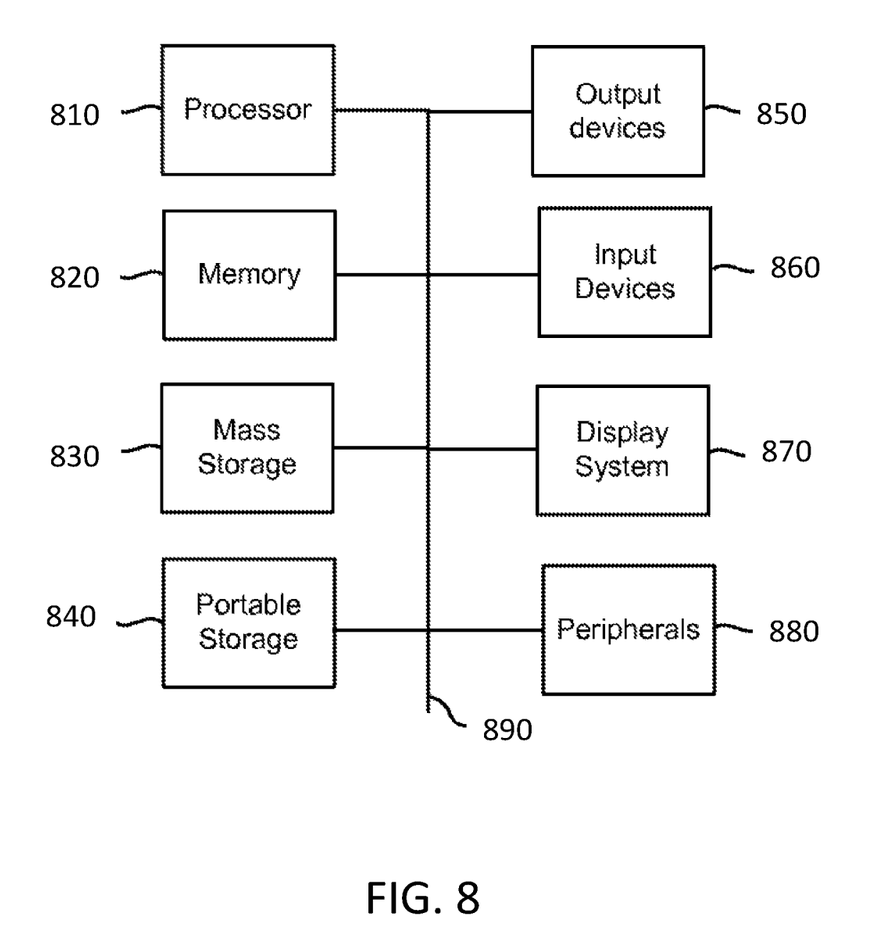
FIG. 8 illustrates an exemplary computing system that may be used to implement all or a portion of a device for use with the present technology.

FIG. 8 illustrates an exemplary computing system that may be used to implement all or a portion of a device for use with the present technology. The computing system 800 of FIG. 8 includes one or more processors 810 and memory 820. Main memory 820 stores, in part, instructions and data for execution by processor 810.

Main memory 820 can store the executable code when in operation. The system 800 of FIG. 8 further includes a mass storage device 830, portable storage medium drive(s) 840, output devices 850, user input devices 860, a graphics display 870, and peripheral devices 880. The components shown in FIG. 8 are depicted as being connected via a single bus 890. However, the components may be connected through one or more data transport means. For example, processor unit 810 and main memory 820 may be connected via a local microprocessor bus, and the mass storage device 430, peripheral device(s) 880, portable storage device 840, and display system 870 may be connected via one or more input/output (I/O) buses. Mass storage device 830, which may be implemented with a magnetic disk drive, solid state drives, an optical disk drive or other devices, may be a non-volatile storage device for storing data and instructions for use by processor unit 810. Mass storage device 830 can store the system software for implementing embodiments of the present invention for purposes of loading that software into main memory 820.

Portable storage device 840 operates in conjunction with a portable non-volatile storage medium, such as a FLASH thumb drive, compact disk or Digital video disc, to input and output data and code to and from the computer system 800 of FIG. 4. The system software for implementing embodiments of the present invention may be stored on such a portable medium and input to the computer system 800 via the portable storage device 840.

Input devices 860 provide a portion of a user interface. Input devices 860 may include an alpha-numeric keypad, such as a keyboard, for inputting alpha-numeric and other information, or a pointing device, such as a mouse, a trackball, stylus, or cursor direction keys. Additionally, the system 800 as shown in FIG. 8 includes output devices 850. Examples of suitable output devices include speakers, printers, network interfaces, and monitors.

Display system 870 may include a liquid crystal display (LCD) or other suitable display device. Display system 870 receives textual and graphical information, and processes the information for output to the display device.

Peripherals 880 may include any type of computer support device to add additional functionality to the computer system. For example, peripheral device(s) 880 may include a modem or a router.

The components contained in the computer system 800 of FIG. 8 are those typically found in computer systems that may be suitable for use with embodiments of the present invention and are intended to represent a broad category of such computer components that are well known in the art. Thus, the computer system 800 of FIG. 8 can be a personal computer, hand held computing device, telephone, mobile computing device, workstation, server, minicomputer, mainframe computer, or any other computing device. The computer can also include different bus configurations, networked platforms, multi-processor platforms, etc. Various operating systems can be used including Unix, Linux, Windows, Macintosh OS, Android, and other suitable operating systems.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. An apparatus for expanding the functionality of a computer, the apparatus comprising:
    a first electronic assembly that attaches to a computer rack assembly, the first electronic assembly including:
        a first portion that extends into a rear portion of the computer rack assembly, the first portion including a first set of liquid interconnects that couple to a liquid manifold included in the rear portion of the computer rack assembly and provides cooling liquid;
        a second portion that includes an expansion space with a front electrical connector and a second set of liquid interconnects; and
        a locking clip included in the expansion space to secure the first electronic assembly to a front portion of the computer rack assembly when a second electronic assembly is inserted into the expansion space; and
    the second electronic assembly to connect to the front electrical connector to be accessible from the front portion of the computer rack assembly, the second electronic assembly including a hot-plug compatible electrical interconnect for connecting circuits on the first electronic assembly to the second electronic assembly, wherein the second electronic assembly expands a functionality of the first electronic assembly.

2. The apparatus of claim 1, wherein the first set of liquid interconnects of the first electronic assembly, couple to a set of cooling connections that provide cooling liquid from the liquid manifold to the first electronic assembly.

3. The apparatus of claim 1, wherein at least one electronic component at the second electronic assembly is powered via the front electrical connector of the first electronic assembly.

4. The apparatus of claim 1, wherein the first electronic assembly includes a rear connector that is an electrical interconnect that electrically connects the first electronic assembly to the computer rack assembly.

5. The apparatus of claim 1, wherein the second electronic assembly includes the hot-plug compatible electrical interconnect for connecting a data signal between the first electronic assembly and the second electronic assembly.

6. The apparatus of claim 1, wherein the second electronic assembly includes a data storage drive.

7. The apparatus of claim 1, wherein the second electronic assembly includes a PCI Express (PCIe) connector.

8. The apparatus of claim 1, wherein the first electronic assembly includes a processor.

9. The apparatus of claim 1, wherein the first set of liquid interconnects that connect the computer rack assembly to the liquid manifold are blind mate connectors.

10. The apparatus of claim 1, wherein the front electrical connector is hot pluggable.

11. A method for expanding the functionality of a computer, the method comprising:

circulating a cooling liquid from a liquid manifold of a computer rack assembly through a first electronic assembly via a first set of liquid interconnects of the first electronic assembly, wherein the first electronic assembly including:
- a first portion that extends into a rear portion of the computer rack assembly; and
- a second portion that includes an expansion space with a second set of liquid interconnects and a front electrical connector to connect to expand a functionality of the first electronic assembly; and securing the first electronic assembly to a front portion of the computer rack assembly via a locking clip included on the second portion when a second electronic assembly is inserted into the expansion space;

connecting circuits on the first electronic assembly to the second electronic assembly via hot-plug compatible electrical interconnects included on the second electronic assembly; and accessing the second electronic assembly from the front portion of the computer rack assembly, wherein the second electronic assembly expands the functionality of the first electronic assembly.

12. The method of claim 11, wherein the first set of liquid interconnects of the first electronic assembly couple to a set of cooling connections that provide cooling liquid from the liquid manifold to the first electronic assembly.

13. The method of claim 11, wherein at least one electronic component at the second electronic assembly is powered via the front electrical connector.

14. The method of claim 11, wherein the first electronic assembly includes a rear electrical connector that is an electrical interconnect to electrically connect the first electronic assembly to the computer rack assembly.

15. The method of claim 11, wherein the second electronic assembly includes a hot-plug compatible electrical interconnect for connecting a data signal between the first electronic assembly and the second electronic assembly.

16. The method of claim 11, wherein the second electronic assembly includes a data storage drive.

17. The method of claim 11, wherein the second electronic assembly includes a PCI Express (PCIe) connector.

18. The method of claim 11, wherein the first electronic assembly includes a processor.

19. The method of claim 11, wherein the first set liquid interconnects that connect to the computer rack assembly are blind mate connectors.

20. The method of claim 15, further comprising:
attaching the second electronic assembly to the first electronic assembly while power is being applied to the first electronic assembly.

* * * * *